(12) United States Patent
Eun et al.

(10) Patent No.: US 8,339,846 B2
(45) Date of Patent: Dec. 25, 2012

(54) FLASH MEMORY DEVICE, PROGRAMMING AND READING METHODS PERFORMED IN THE SAME

(75) Inventors: Hee-seok Eun, Hwaseong-si (KR); Jong-han Kim, Suwon-si (KR); Jae-hong Kim, Seoul (KR); Dong-hyuk Chae, Seoul (KR); Seung-hwan Song, Suwon-si (KR); Han-woong Yoo, Seoul (KR); Jun-jin Kong, Yongin-si (KR); Young-hwan Lee, Suwon-si (KR); Kyoung-lae Cho, Suwon-si (KR); Yong-june Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 284 days.

(21) Appl. No.: 12/856,698

(22) Filed: Aug. 16, 2010

(65) Prior Publication Data
US 2011/0038207 A1 Feb. 17, 2011

(30) Foreign Application Priority Data
Aug. 14, 2009 (KR) .................. 10-2009-0075334

(51) Int. Cl.
*G11C 16/04* (2006.01)
(52) U.S. Cl. ......... 365/185.03; 365/185.18; 365/185.23; 365/185.24
(58) Field of Classification Search ............. 365/185.03, 365/185.18, 185.23, 185.24
See application file for complete search history.

(56) References Cited

U.S. PATENT DOCUMENTS

| | | | | |
|---|---|---|---|---|
| 7,443,732 B2 * | 10/2008 | Kuo et al. | ................ | 365/185.22 |
| 7,489,543 B1 * | 2/2009 | Lee | ................ | 365/185.03 |
| 7,768,827 B2 * | 8/2010 | Kang | ................ | 365/185.03 |
| 7,782,666 B2 * | 8/2010 | Cho et al. | ................ | 365/185.03 |
| 8,050,097 B2 * | 11/2011 | Wang | ................ | 365/185.18 |
| 8,072,804 B2 * | 12/2011 | Lee et al. | ................ | 365/185.03 |
| 8,194,450 B2 * | 6/2012 | Lee | ................ | 365/185.03 |
| 2008/0144370 A1 * | 6/2008 | Park et al. | ................ | 365/185.03 |

FOREIGN PATENT DOCUMENTS

| | | |
|---|---|---|
| KR | 2005-092923 | 4/2005 |
| KR | 2006-260711 | 9/2006 |
| KR | 100773400 B1 | 10/2007 |

* cited by examiner

*Primary Examiner* — Viet Q Nguyen
(74) *Attorney, Agent, or Firm* — Volentine & Whitt, PLLC

(57) ABSTRACT

The flash memory device includes a control logic circuit and a bit level conversion logic circuit. The control logic circuit programs first through $N^{th}$ bits of data in a memory cell array of the N-bit MLC flash memory device or reads the first through $N^{th}$ bits of the data from the memory cell array in response to one of a program command and a read command. The bit level conversion control logic circuit, after the first through $N^{th}$ bits of the data are completely programmed or read, programs or reads an $(N+1)^{th}$ bit of the data in response to a control signal. The bit level conversion control logic circuit converts voltage levels of voltages, which are used for programming or reading the first through $N^{th}$ bits of the data, to program or read for $2^N$ cell distributions of $2^{N+1}$ cell distributions corresponding to the $(N+1)^{th}$ bit of the data and then programs or reads for other $2^N$ cell distributions.

3 Claims, 18 Drawing Sheets

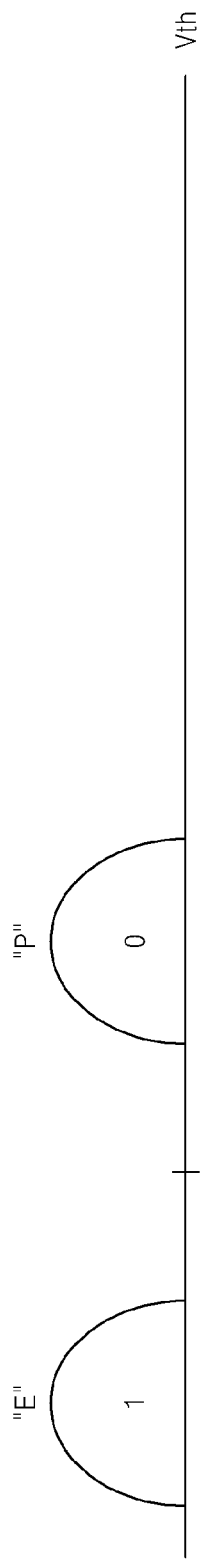
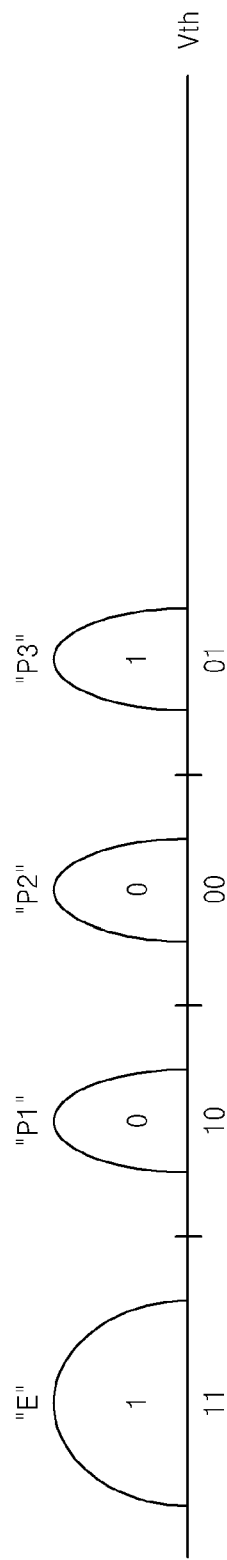
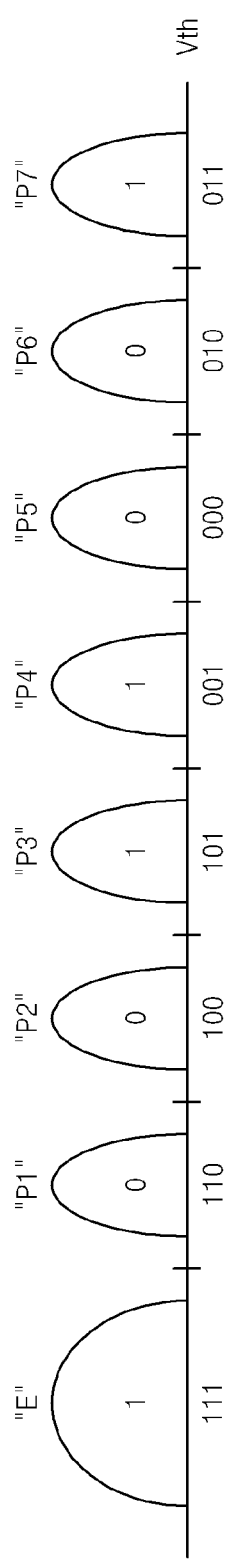

FLASH MEMORY DEVICE, PROGRAMMING AND READING METHODS PERFORMED IN THE SAME

CROSS-REFERENCE TO RELATED APPLICATION(S)

A claim of priority is made to Korean Patent Application No. 10-2009-0075334, filed on Aug. 14, 2009, in the Korean Intellectual Property Office, the disclosure of which is incorporated herein in its entirety by reference.

BACKGROUND

The inventive concept relates to a flash memory device and a programming method performed in the same, and more particularly, to a flash memory device in which the number of bits stored in each memory cell exceeds the designed memory cell bit capacity of the flash memory device.

A flash memory device is a nonvolatile memory which maintains stored data even in the absence of applied power. The flash memory device, which can be utilized for mass data storage and even code storage, is commonly adopted in mobile devices such as cellular phones, personal digital assistants (PDA), digital cameras, portable game consoles, and Moving Picture Experts Group-3 players (MP3P). Flash memory is also commonly found in non-mobile home applications including high definition televisions (HDTV), digital versatile disc (DVD), routers, personal computers, and global positioning systems (GPS).

SUMMARY

According to an aspect of the inventive concepts, there is provided an N-bit MLC (Multi-Level Cell) flash memory which includes a control logic circuit and a bit level conversion logic circuit. The control logic circuit programs first through $N^{th}$ bits of data in a memory cell array of the N-bit MLC flash memory device or reads the first through $N^{th}$ bits of the data from the memory cell array in response to one of a program command and a read command, respectively. The bit level conversion control logic circuit, after the first through $N^{th}$ bits of the data are completely programmed or read, programs or reads an $(N+1)^{th}$ bit of the data in response to a control signal. The bit level conversion control logic circuit converts voltage levels of voltages, which are used for programming or reading the first through $N^{th}$ bits of the data, to program or read for $2^N$ cell distributions of $2^{N+1}$ cell distributions corresponding to the $(N+1)^{th}$ bit of the data and then programs or reads for other $2^N$ cell distributions.

According to another aspect of the inventive concepts, there is provided a programming method performed in an N-bit MLC flash memory device. The method includes programming first through $N^{th}$ bits of data in a memory cell array of the N-bit MLC flash memory device in response to a program command. The method further includes, after the first through $N^{th}$ bits of the data are completely programmed, programming an $(N+1)^{th}$ bit of the data by converting voltage levels of voltages, which are used for programming the first through $N^{th}$ bits of data, to program for $2^N$ cell distributions of $2^{N+1}$ cell distributions corresponding to an $(N+1)^{th}$ bit of the data and then program for other $2^N$ cell distributions.

According to another aspect of the inventive concepts, there is provided a reading method performed in an N-bit MLC flash memory device. The method includes reading first through $N^{th}$ bits of data in a memory cell array of the N-bit MLC flash memory device in response to a read command. The method further includes, after the first through $N^{th}$ bits of the data are completely read, reading an $(N+1)^{th}$ bit of the data by converting voltage levels of voltages, which are used for reading the first through $N^{th}$ bits of the data, to read for $2^N$ cell distributions of $2^{N+1}$ cell distributions corresponding to the $(N+1)^{th}$ bit of the data and then reading for other $2^N$ cell distributions.

According to another aspect of the inventive concepts, there is provided an N-bit MLC flash memory device which includes a control logic circuit and a bit level conversion logic circuit. The control logic circuit programs first through $N^{th}$ bits of data in a memory cell array of the N-bit MLC flash memory device or reads the first through $N^{th}$ bits of the data from the memory cell array in response to one of a program command and a read command, respectively. The bit level conversion control logic circuit, after the first through $N^{th}$ bits of the data are completely programmed or read, programs or reads an $(N+1)^{th}$ through $(N+i)^{th}$ bits of the data in response to a control signal. The bit level conversion control logic circuit converts voltage levels of voltages, which are used for programming or reading the first through $N^{th}$ bits of the data, to sequentially program or read the $(N+1)^{th}$ through $(N+i)^{th}$ bits of the data using the converted voltages.

In the aspects summarized above, N and i are each natural numbers of at least 2.

BRIEF DESCRIPTION OF THE DRAWINGS

Exemplary embodiments of the inventive concepts will become readily understood from the detailed description that follows, taken in conjunction with the accompanying drawings, in which:

FIGS. 2A through 2C illustrates cell distributions in the flash memory device of FIG. 1;

DETAILED DESCRIPTION OF THE EMBODIMENTS

Figure 1:
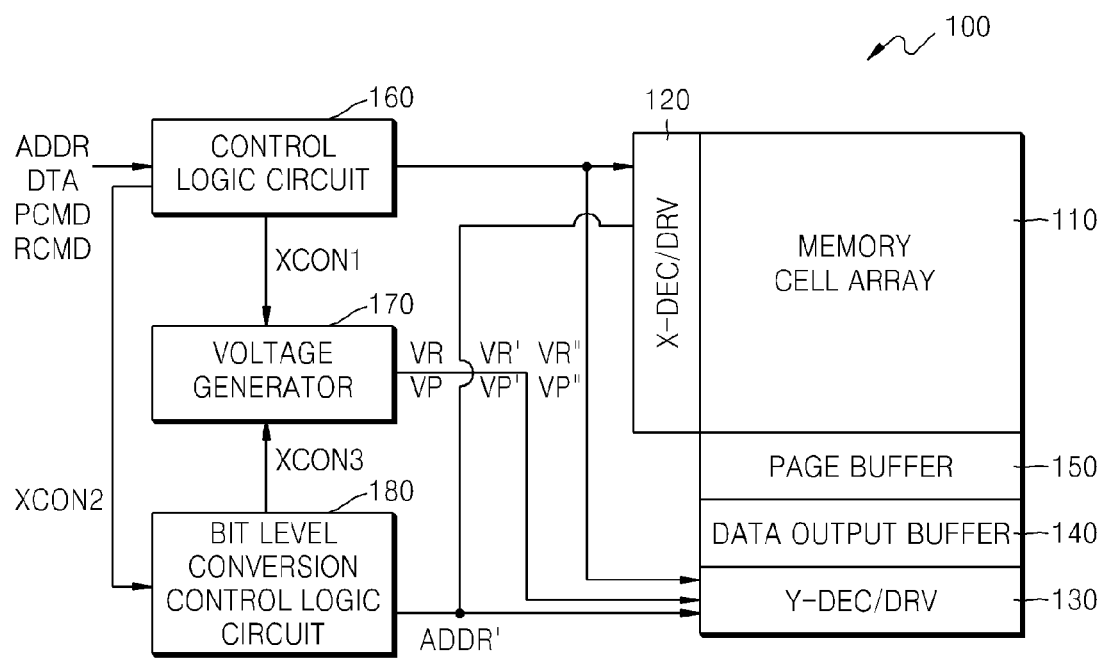
FIG. 1 is a block diagram of a flash memory device according to an embodiment of the inventive concepts.

The attached drawings for illustrating exemplary embodiments of the inventive concept are referred to in order to gain a sufficient understanding of the inventive concept, the merits thereof, and the objectives accomplished by the implementation of the inventive concept.

Hereinafter, the inventive concept will be described in detail by explaining exemplary embodiments of the inventive concept with reference to the attached drawings. Like reference numerals in the drawings denote like elements.

FIG. 1 is a block diagram of a flash memory device according to an embodiment of the inventive concepts.

Referring to FIG. 1, a flash memory device 100 according to the current embodiment includes a memory cell array 110, a page buffer 150, an X-decoder/driver 120, a Y-decoder/driver 130, a control logic circuit 160, a voltage generator 170, and a bit level conversion control logic circuit 180.

The control logic circuit 160 receives a program command PCMD and an address ADDR from an external source. The control logic circuit 160 also receives data DTA which is to be programmed. Here, the address ADDR may indicate a logical or physical position of the memory cell array 110 in which the data DTA is to be programmed. The data DTA, the program command PCMD, and the address ADDR are separately illustrated in FIG. 1, but the data DTA and the address ADDR may be included in the program command PCMD.

The control logic circuit 160 transmits the address ADDR to the X-decoder/driver 120 and the Y-decoder/driver 130. The control logic circuit 160 may, for example, be implemented as a peripheral circuit of a flash memory or a memory controller positioned outside the flash memory.

The X-decoder/driver 120 activates pages of the memory cell array 110 corresponding to the address ADDR. The Y-decoder/driver 130 activates columns corresponding to the address ADDR.

The control logic circuit 160 also transmits a first control signal XCON1 corresponding to the program command PCMD and the data DTA to the voltage generator 170. The voltage generator 170 generates a program voltage VP corresponding to a bit value of the data DTA in response to the first control signal XCON1. The program voltage VP is transmitted to the Y-decoder/driver 130.

The Y-decoder/driver 130 applies the program voltage VP corresponding to the bit value of the data DTA to the activated columns.

The program voltage VP may be set to threshold voltage levels corresponding to cell distributions with respect to bit values as shown in FIGS. 2A through 2C. FIG. 2A illustrates a cell distribution in a Single-Level Cell (SLC) flash memory device, and FIGS. 2B and 2C illustrate cell distributions in a Multi-Level Cell (MLC) flash memory device.

An MLC memory device is characterized by programming of 2 or more bits of stored data in each single memory cell. FIG. 2B illustrates an example of a cell distribution in a 2-bit MLC flash memory device, and FIG. 2C illustrates an example of a cell distribution in a 3-bit MLC flash memory device.

In the SLC flash memory device of FIG. 2A, each of memory cells has one of an erase state E and a program state P. In the 2-bit MLC flash memory device of FIG. 2B, each of memory cells has one of four states, i.e., an erase state E and first through third program states P1, P2, and P3. In the 3-bit MLC flash memory device of FIG. 2C, each of memory cells has one of eight states, i.e., an erase state E and first through seventh program states P1, P2, P3, P4, P5, P6, and P7. In the examples of FIGS. 2A through 2C, a gray code is adopted in which a single-bit differs between the bit(s) designations mapped to each of the program states.

For convenience, a Multi-Level Cell flash memory device is referred to as an MLC flash memory device. In the description that follows, the operational description of a 2-bit MLC flash memory device will be primarily presented by way of example.

A lower bit of two bits programmed in one memory cell is referred to as a least significant bit (LSB), and an upper bit of the two bits is referred to as a most significant bit (MSB). The LSB and the MSB are programmed in the same cell which is connected to the same wordline on a cell array. When considering a general programming method (i.e., a programming method for separately programming a corresponding bit), 2-bit data constitutes two different pages. Thus, an LSB and an MSB programmed in one memory cell may be respectively programmed by different page addresses.

Figure 3:
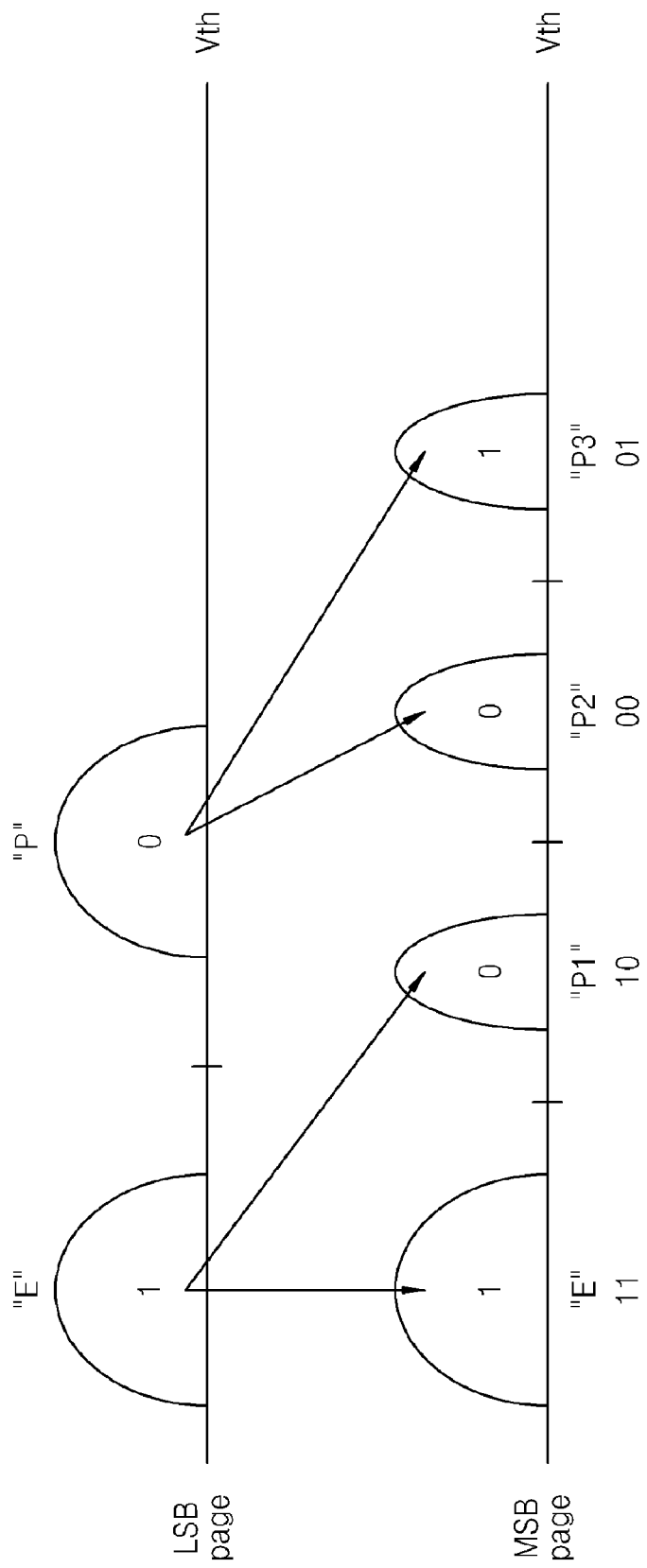
FIG. 3 illustrates a programming operation performed in a 2-bit Multi-Level Cell (MLC) flash memory.

A page for the LSB and a page for the MSB are respectively referred to as an LSB page and an MSB page. According to a programming operation performed in a 2-bit MLC flash memory device as illustrated in FIG. 3, an LSB page for a plurality of memory cells is programmed, and then an MSB page is programmed from cell distributions of the LSB page.

Figure 4:
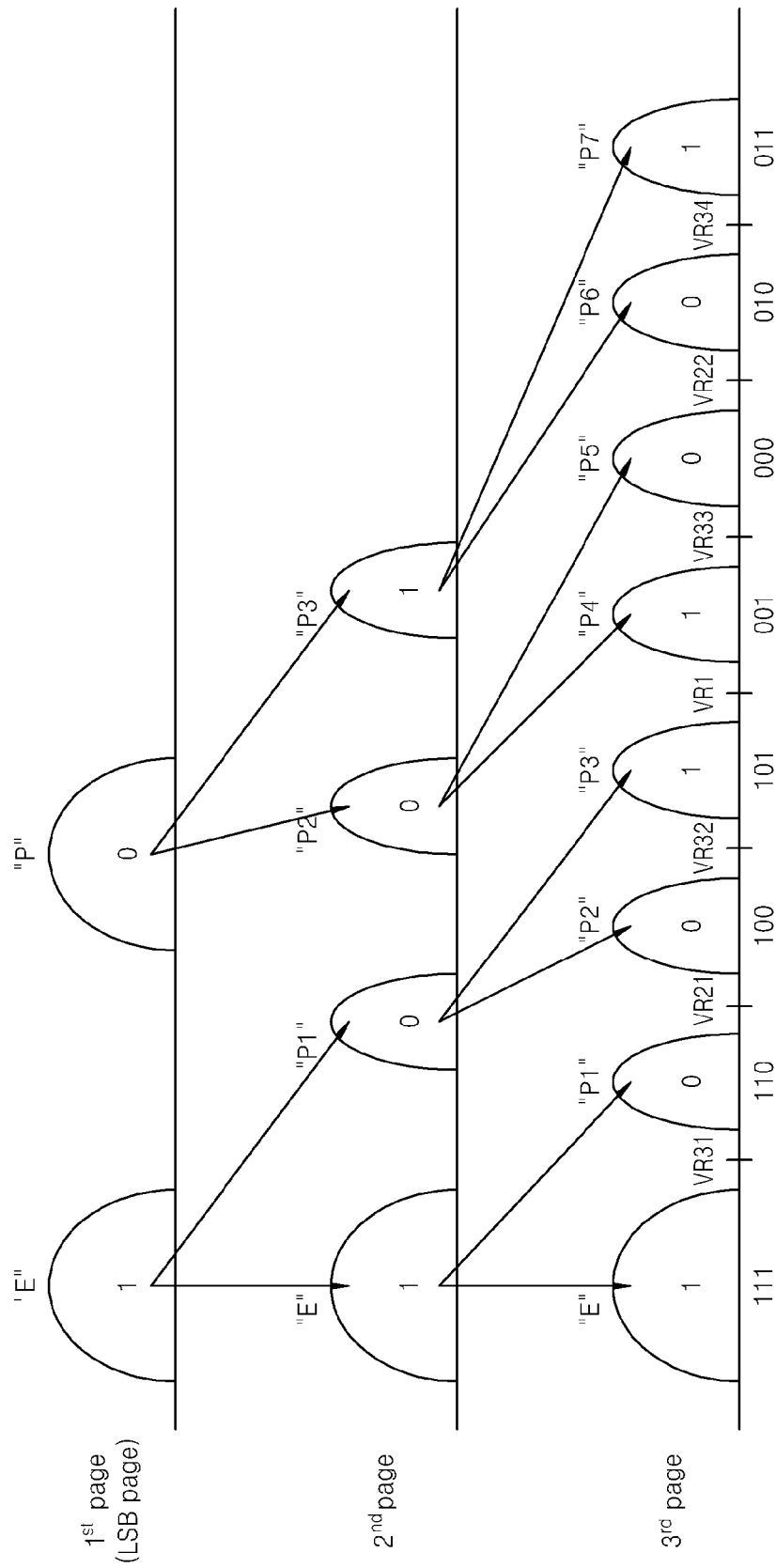
FIG. 4 illustrates a programming operation performed in a 3-bit MLC flash memory device.

FIG. 4 illustrates an example of programming a 3-bit MLC flash device. As shown, an LSB page (a first page) is programmed, then a second page are programmed, and then a third page is programmed. Similarly, an n-bit MLC flash memory device (where n is 4 or more) can be programmed by a sequence of n page programming operations.

Referring again to FIG. 1, the flash memory device 100 may be an N-bit MLC flash memory device in which N (which is a natural number equal to or more than 2) bits are programmed in one memory cell. However, the N-bit MLC flash memory device may program N bits or the larger number of bits than the number of N bits in one memory cell. This is because a write scheme and a read scheme are fixed according to the number of corresponding bits.

For example, a 2-bit MLC flash memory device may be designed to generate three program voltages and program 2 bits in one memory cell, and a 3-bit MLC flash memory device may be designed to generate seven program voltages and program 3 bits in one memory cell. Also, an N-bit MLC flash memory device may be designed to allocate N page addresses to one wordline. As described above, different addresses are respectively allocated to pages for bits. Therefore, N+1 or more bits of data may not be programmed in one memory cell without changing a design of a logic circuit in the N-bit MLC flash memory device.

The flash memory device 100 includes the bit level conversion control logic circuit 180 so that N+1 or more bits are programmed in every memory cell and read from memory cells in which the N+1 or more bits are programmed, even in the N-bit MLC flash memory device. This will be described in more detail later herein.

Figure 5:
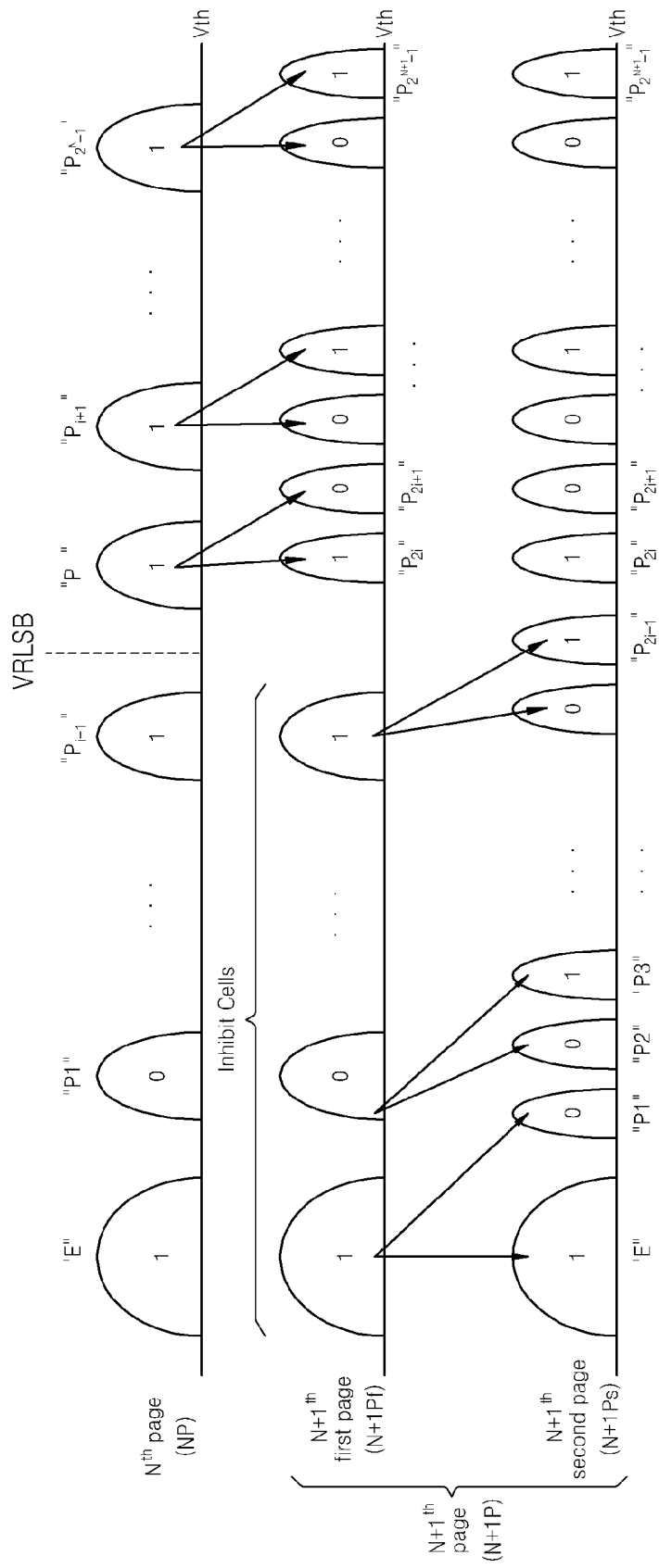
FIG. 5 illustrates operations of programming N+1 bits in an N-bit MLC flash memory device according to an embodiment of the inventive concepts.
Figure 6:
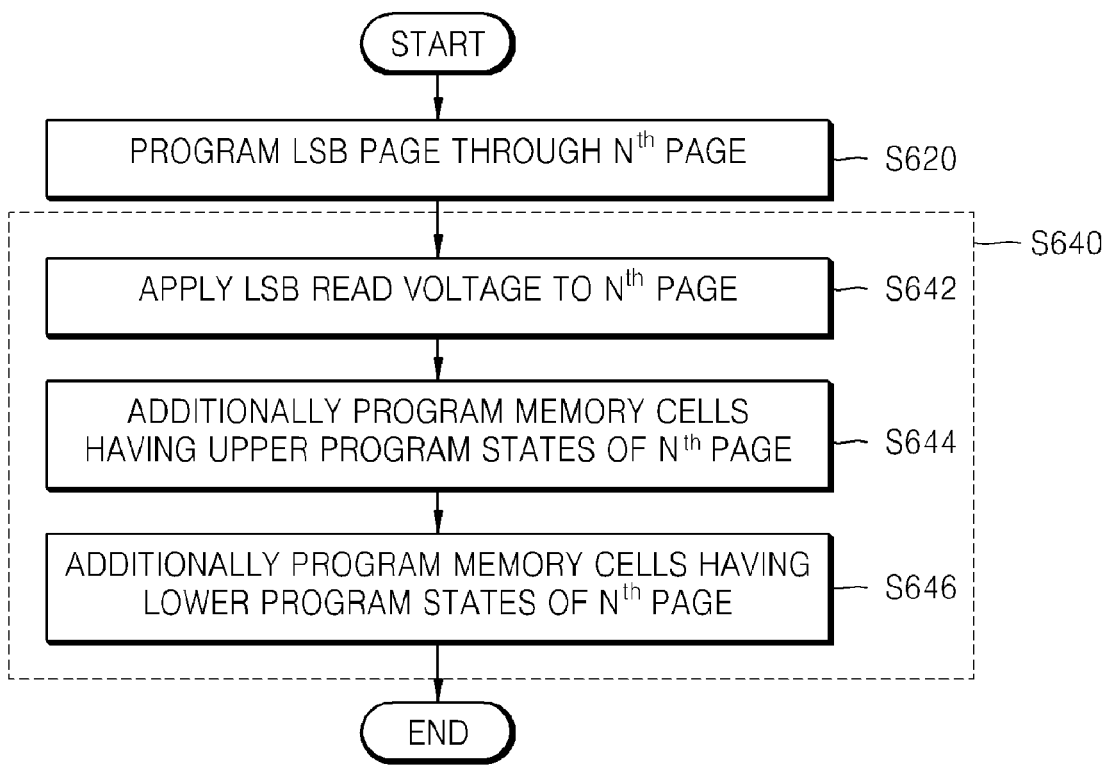
FIG. 6 is a flowchart of a programming method performed in the flash memory device of FIG. 1, according to an embodiment of the inventive concepts.

FIG. 5 illustrates a programming operation performed in the flash memory device 100 of FIG. 1, according to an embodiment of the inventive concepts, and FIG. 6 is a flowchart of a programming method performed in the flash memory device 100 of FIG. 1, according to an embodiment of the inventive concepts.

Referring to FIGS. 1, 5, and 6, according to the N-bit MLC flash memory device 100 and a programming method 600 according to an embodiment of the inventive concepts, the control logic circuit 160 programs upper N bits of the data DTA in response to the program command PCMD in operation S620. Here, the data DTA may include N+1 or more bits.

As described above, N programming operations are necessary to program N bits in each memory cell. In other words, programming operations for N pages are carried out in S620.

The programming operations for the upper N bits of the data DTA are as described with reference to FIGS. 3 and 4. Therefore, when an $N^{th}$ page is completely programmed, a cell distribution of memory cells (not shown) of the memory cell array 100 may have one of states of a cell distribution of an $N^{th}$ page of FIG. 5. In other words, the memory cells may be formed in one state among an erase state E state and $2^N$-1 program states according to bit values of N bits of data which is to be stored.

When the $N^{th}$ page is completely programmed, the control logic circuit 160 transmits a second control signal XCON2 to the bit level conversion control logic circuit 180, wherein the second control signal XCON2 includes information on an other bit (or other bits) of the data DTA to be programmed, information on voltage levels of program voltages of the $N^{th}$ page, and information on an address. For example, if the data DTA to be programmed includes N+1 bits, the second control signal XCON2 may include information on an MSB which is not programmed in operation S620.

Figure 8:
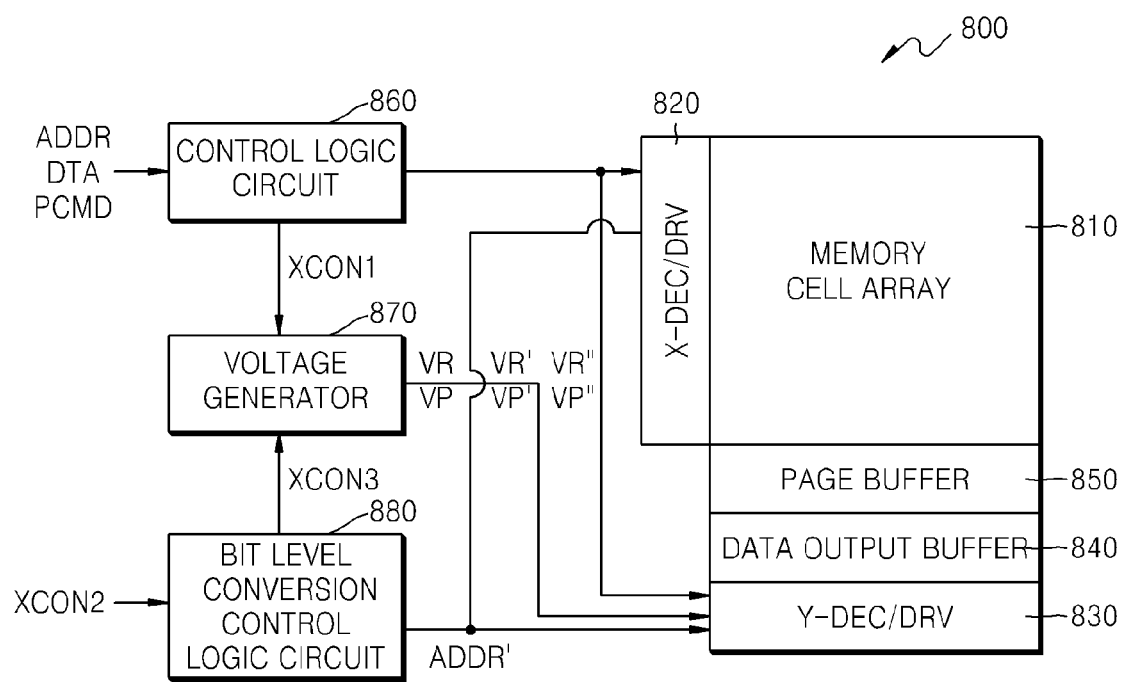
FIG. 8 is a block diagram of a flash memory device according to another embodiment of the inventive concepts.

The second control signal XCON2 is generated by the control logic circuit 160 in FIG. 1, but the inventive concepts are not limited thereto. For example, referring to a flash memory device 800 illustrated in FIG. 8, an external controller (not shown) may directly transmit a second control signal XCON2 to a bit level conversion control logic circuit 880. For example, the external controller may transmit upper N bits of data DTA to a control logic circuit 860 and another bit (or other bits) to the bit level conversion control logic circuit 880. The remaining blocks of FIG. 8, namely, the memory cell array 810, X-decoder 820, page buffer 850, data output buffer 840, Y-decoder/driver 830, and voltage generator 870 are the same as or similar to the like-named blocks of FIG. 1, and thus a detailed description thereof is omitted here to avoid redundancy.

Referring to FIGS. 1, 5, and 6 again, an $N+1^{th}$ bit ($N+1^{th}$ page) is programmed in the N-bit MLC flash memory device 100 in operation S640. In particular, in operation S642, the bit level conversion control logic circuit 180 applies an LSB read voltage VRLSB to the $N^{th}$ page in response to the second control signal XCON2.

The LSB read voltage VRLSB is a read voltage for an LSB page. The LSB read voltage VRLSB is used to distinguish program states of an LSB page when reading data after N bits are completely programmed in the N-bit MLC flash memory device. Therefore, the LSB read voltage VRLSB has a voltage level between a $(i-1)^{th}$ program state $P_{i-1}$ and an $i^{th}$ program state $P_i$ among $2^N$-1 program states of the $N^{th}$ page and an erase state E of the $N^{th}$ page.

If the LSB read voltage VRLSB is applied, memory cells, which each have one of an erase state E and program states P1, . . . , and $P_{i-1}$ having lower voltage levels than the voltage level of the LSB read voltage VRLSB, are inhibited. In other words, data values programmed in memory cells each having corresponding states are not programmed in a first programming process (a programming process for upper program states of the $N^{th}$ page which will be described later) for a $N+1^{th}$ page.

If the LSB read voltage VRLSB is applied, data values, which are programmed in memory cells having one of program states $P_i$, $P_{i+1}$, . . . , and $P_2{}^N{}_{-1}$ having higher voltage levels than the voltage level of the LSB read voltage VRLSB, are read.

For convenience, program states and an erase state having lower voltage levels than an LSB read voltage are referred to as lower program states, and program states having higher voltage levels than the LSB read voltage are referred to as upper program states.

Data values, which are programmed in memory cells having upper program states $P_i$, $P_{i+1}$, . . . , and $P_2{}^N{}_{-1}$ of the $N^{th}$ page, may be read using read voltages of the N-bit MLC flash memory device 100. This will be described in more detail later herein.

If reading is performed with respect to the upper program states $P_i$, $P_{i+1}$, . . . , and $P_2{}^N{}_{-1}$ of the $N^{th}$ page according to the application of the LSB read voltage VRLSB, an $N+1^{th}$ bit is programmed from the upper program states $P_i$, $P_{i+1}$, . . . , and $P_2{}^N{}_{-1}$ of the $N^{th}$ page in operation S644. In other words, an $(N+1)^{th}$ page is programmed.

A program state $P_{2i}$ of program states $P_{2i}$, $P_{2i+1}$, . . . , and $P(_2{}^{N+1}{}_{-1})$ of the $N+1^{th}$ page, which are programmed corresponding to the upper program states $P_i$, $P_{i+1}$, . . . , and $P_2{}^N{}_{-1}$ of the $N^{th}$ page, wherein the program state $P_{2i}$ has a lowest voltage level, may be formed by programming memory cells having the program state $P_i$ of the upper program states $P_i$, $P_{i+1}$, . . . , and $P_2{}^N{}_{-1}$ of the $N^{th}$ page having a lowest voltage level. Alternatively, the program state $P_{2i}$ may be formed by maintaining the program state $P_i$ without an additional programming operation.

The bit level conversion control logic circuit 180 may set an address of the $N+1^{th}$ page to an address ADDR' of the $N^{th}$ page to program the $(N+1)^{th}$ page. For example, an LSB address for the $N^{th}$ page may be used to apply the LSB read voltage VRLSB. An MSB of the $(N+1)^{th}$ page (an $(N+1)^{th}$ bit) may be programmed using an MSB address of the $N^{th}$ page.

The bit level conversion control logic circuit 180 converts the program voltage VP, which is used to program the $N^{th}$ page, into a program voltage VP' having a different voltage level from the voltage level of the program voltage VP to program the $(N+1)^{th}$ page. The bit level conversion control logic circuit 180 transmits a third control signal XCON3 to the voltage generator 170 so that the voltage generator 170 converts the voltage level of the program voltage VP for the $N^{th}$ page to generate the program voltage VP' for the $(N+1)^{th}$ page.

If the $(N+1)^{th}$ page corresponding to the upper program states $P_i$, $P_{i+1}$, . . . , and $P_2{}^N{}_{-1}$ of the $N^{th}$ page is completely programmed in operation S644, the bit level conversion control logic circuit 180 programs an $(N+1)^{th}$ page corresponding to lower program states E, P1, . . . , and $P_{i-1}$ of the $N^{th}$ page in operation S646.

Like the operation of programming the $(N+1)^{th}$ page corresponding to the upper program states $P_i$, $P_{i+1}$, . . . , and $P_2{}^N{}_{-1}$ of the $N^{th}$ page, the bit level conversion control logic circuit 180 may set the address ADDR' of the $N^{th}$ page to an address of the $(N+1)^{th}$ page corresponding to the low program states E, P1, . . . , and $P_{i-1}$ of the $N^{th}$ page.

The bit level conversion control logic circuit 180 may convert the program voltage VP', which is used to program the $N^{th}$ page, into a program voltage VP" having a different voltage level from the voltage level of the program voltage VP' to program the $(N+1)^{th}$ page corresponding to the lower program states E, P1, . . . , and $P_{i-1}$ of the $N^{th}$ page.

Here, an erase state E of the $(N+1)^{th}$ page may be formed by additionally programming or maintaining the erase state E of the $N^{th}$ page.

In the example of the above-described embodiment, the $(N+1)^{th}$ page corresponding to the upper program states $P_i$, $P_{i+1}$, . . . , and $P_{2^N-1}$ of the $N^{th}$ page is programmed, and the $(N+1)^{th}$ page corresponding to the lower program states E, P1, . . . , and $P_{i-1}$ of the $N^{th}$ page is programmed to program the $(N+1)^{th}$ page.

Figure 7:
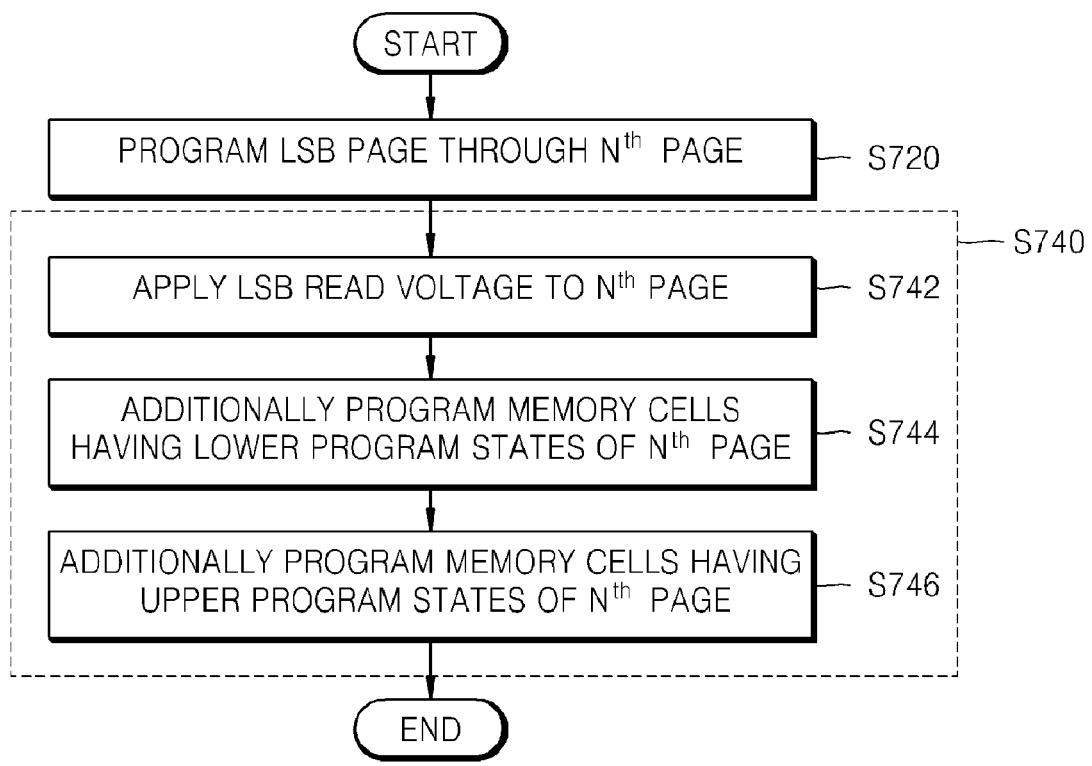
FIG. 7 is a flowchart of a programming method performed in the N-bit MLC flash memory of FIG. 5, according to another embodiment of the inventive concepts.

However, the inventive concepts are not limited thereto. For example, referring to programming method 700 illustrated in FIG. 7, after operation S720 is performed to program an LSB page through an $N^{th}$ page, operation S744 may be first performed to program an $N+1^{th}$ page corresponding to lower program states E, P1, . . . , and $P_{i-1}$ of the $N^{th}$ page. Operation S740 may be performed to program an $(N+1)^{th}$ page corresponding to upper program states $P_i$, $P_{i+1}$, . . . , and $P_{2^N-1}$ of the $N^{th}$ page.

In the case of the embodiment described with reference to FIG. 6, cell distributions $P_{2i}$, $P_{2i+1}$, . . . , $P_2^{N+1}-1$, which are formed by programming the $(N+1)^{th}$ page corresponding to the upper program states $P_i$, $P_{i+1}$, . . . , and $P_{2^N-1}$ of the $N^{th}$ page, have higher voltage levels than cell distributions which are formed by programming the $(N+1)^{th}$ page corresponding to the lower program states E, P1, . . . , and $P_{i-1}$ of the $N^{th}$ page. Thus, the cell distributions formed by programming the $(N+1)^{th}$ page corresponding to the lower program states E, P1, . . . , and $P_{i-1}$ of the $N^{th}$ page, may be changed to a lesser degree.

According to the example of the above-described method, upper and lower program states of an $N^{th}$ page may be sequentially programmed. Thus, N+1 or more bits may be programmed in one memory cell of an N-bit MLC flash memory device without changing designs of a read voltage and an address in the N-bit MLC flash memory device. In other words, the flash memory device 100 may program N+1 or more bits in one memory cell of an N-bit MLC flash memory device.

A reading operation will be described next with reference to FIGS. 9 and 10. The reading operation is performed in the N-bit MLC flash memory device 100 in which the N+1 or more bits are programmed in one memory cell.

Figure 9:
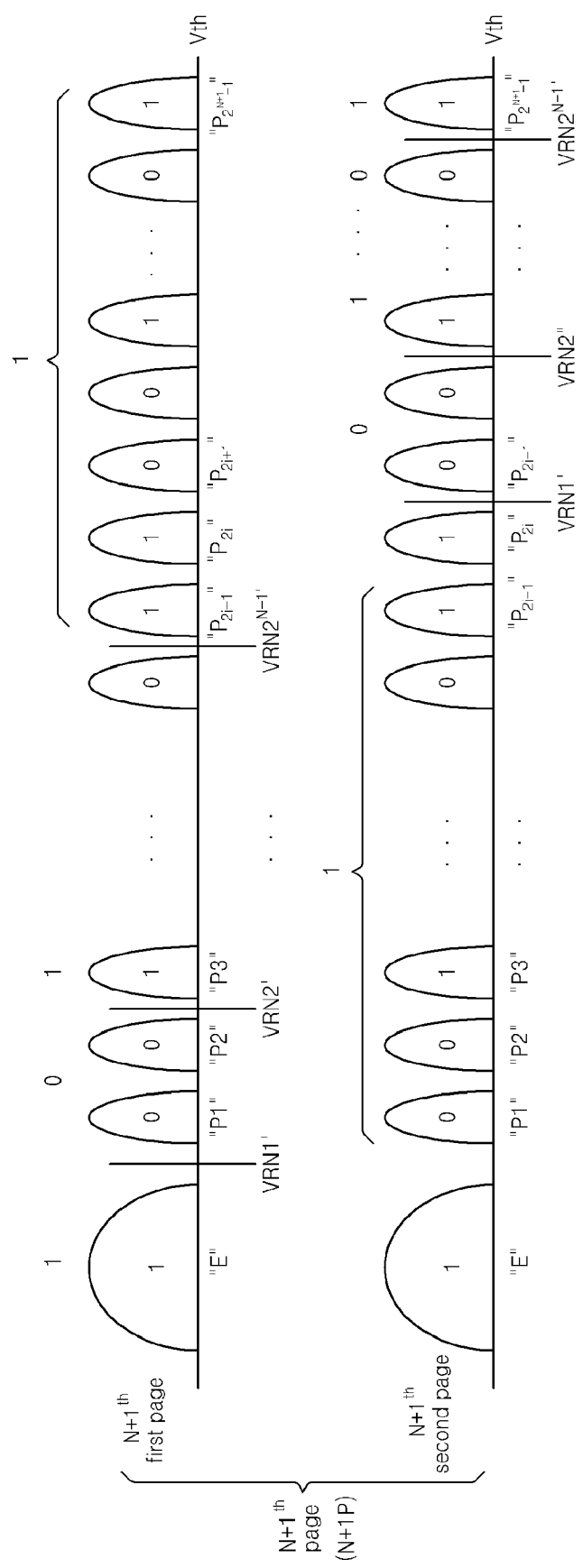
FIG. 9 illustrates a reading operation performed in the N-bit MLC flash memory of FIG. 5, according to an embodiment of the inventive concepts.
Figure 10:
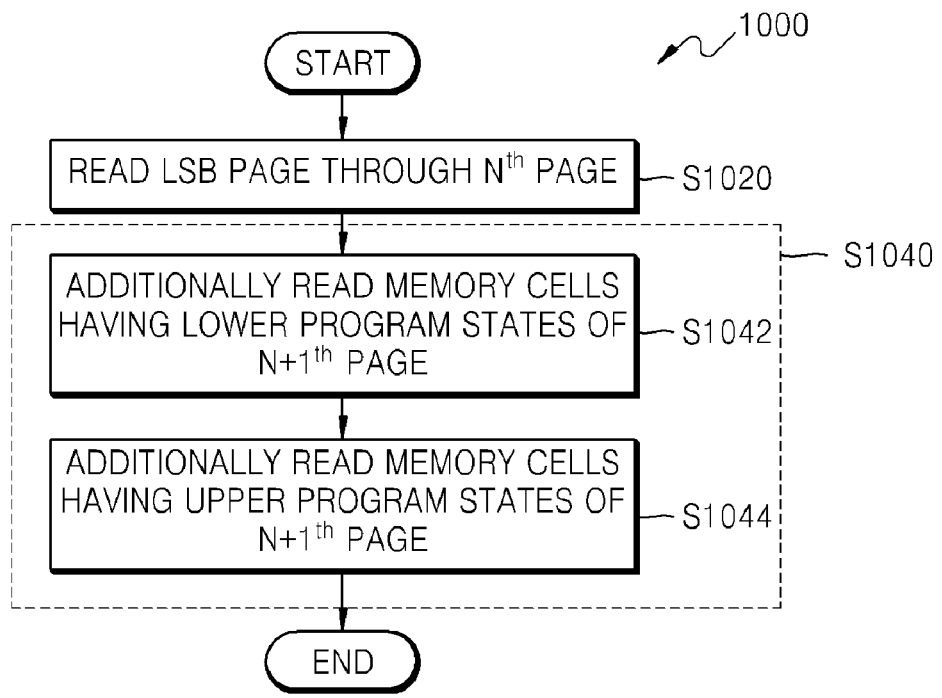
FIG. 10 is a flowchart of a reading method performed in the N-bit MLC flash memory of FIG. 5, according to an embodiment of the inventive concepts.

Referring to FIGS. 1, 9, and 10, according to the N-bit MLC flash memory device 100 and a reading method 1000 thereof, in operation S1020, reading operations are performed with respect to a first page (an LSB page) through an $N^{th}$ page. The control logic circuit 160 receives a read command RCMD and an address ADDR from an external source. Here, the address ADDR may indicate a logical or physical position of the memory cell array 110 in which data to be read is stored.

The control logic circuit 160 transmits the address ADDR to the X-decoder/driver 120 and the Y-decoder/driver 130.

The X-decoder/driver 120 activates one of pages of the memory cell array 110 corresponding to the address ADDR. The page buffer 150 storages the page activated by the X-decoder/driver 120.

The Y-decoder/driver 130 activates columns corresponding to the address ADDR from the page stored in the page buffer 150. Data programmed in memory cells connected to the corresponding columns of the corresponding page is sensed and output through a data output buffer 140.

The control logic circuit 160 transmits a first control signal XCON1 corresponding to the read command RCMD to the voltage generator 170. The voltage generator 170 generates a read voltage VR in response to the first control signal XCON1 and transmits the read voltage VR to the Y-decoder/driver 130. The control logic circuit 160 may generate the first control signal XCON1 corresponding to the read command RCMD to have a different level from the first control signal XCON1 corresponding to the program command PCMD.

Reading operations with respect to the first through $N^{th}$ pages will be described with reference to the example of FIG. 4. For example, a read voltage VR1 having a voltage level between third and fourth program states P3 and P4 is applied to read an LSB of data which is programmed in one state of program states of a third page of FIG. 4. A read voltage VR21 having a voltage level between first and second program states P1 and P2 and a read voltage VR22 between fifth and sixth program states P5 and P6 are applied to read a bit next to the LSB.

A read voltage VR31 having a voltage level between an erase state E and a first program state P1, a read voltage VR32 having a voltage level between second and third program states P2 and P3, a read voltage VR33 having a voltage level between fourth and fifth program states P4 and P5, and a read voltage VR34 having a voltage level between sixth and seventh program states P6 and P7 are applied to read whether an MSB of the programmed data is 0 or 1.

As described above, the reading operations are performed with respect to the first through $N^{th}$ pages using read voltages (one read voltage for the first page, two read voltages for a second page, . . . , and $2^N-1$ read voltages for the $N^{th}$ page) having voltage levels for distinguishing program states of each of the first through $N^{th}$ pages.

Referring again to FIGS. 1, 9, and 10, when operation S1020 is completely performed, a reading operation is performed with respect to an $(N+1)^{th}$ page in operation S1040 of the N-bit MLC flash memory device 100 and the programming method 1000. The control logic circuit 160 may transmit a second control signal XCON2 to the bit level conversion control logic circuit 180.

The control logic circuit 160 may generate the second control signal XCON2 in the reading operation to have a different voltage level from the second control signal XCON2 in the programming operation. The second control signal XCON2 may include information on voltage levels of read voltages of the $N^{th}$ page, information on an address of the $N^{th}$ page, and the like. For convenience, the read voltages of the $N^{th}$ page are referred to as VRN1, VRN2, . . . , and VRN$2^{N-1}$.

In operation S1042, the bit level conversion control logic circuit 180 performs reading operations with respect to lower program states E, P1, . . . , and $P_{2i-1}$ of the $(N+1)^{th}$ page in response to the second control signal XCON2 to perform the reading operation with respect to the $(N+1)^{th}$ page.

For convenience, an erase state E and program states of the $(N+1)^{th}$ page of FIG. 5, which are programmed to correspond to the lower program states E, P1, . . . , and $P_{i-1}$ of the $N^{th}$ page, will be referred to as lower program states E, P1, . . . , and $P_{2i-1}$ of the $(N+1)^{th}$ page. Also, program states of the $(N+1)^{th}$ page of FIG. 5, which are programmed to correspond to the upper program states $P_i$, $P_{i+1}$, . . . , and $P_{N-1}$ of the $N^{th}$ page, will be referred to upper program states $P_{2i}$, $P_{2i+1}$, . . . , and $P_2^N-1$ of the $(N+1)^{th}$ page.

Referring again to FIGS. 1, 9, and 10, the bit level conversion control logic circuit 180 may set an address ADDR' of the $N^{th}$ page to an address of the $(N+1)^{th}$ page to read the $(N+1)^{th}$ page. The bit level conversion control logic 180 converts the read voltages VRN1, VRN2, . . . , and VRN$2^{N-1}$ for the $N^{th}$ page into read voltages VRN1', VRN2', . . . , and VRN$2^{N-1'}$ having voltage levels among the lower program states E, P1, . . . , and $P_{2i-1}$ of the $(N+1)^{th}$ page to perform reading operations with respect to memory cells having the lower program states E, P1, . . . , and $P_{2i-1}$ of the $(N+1)^{th}$ page.

The bit level conversion control logic 180 may transmit a third control signal XCON3 to the voltage generator 170 so that the voltage generator 170 generates read voltages VR' (VRN1', VRN2', . . . , and VRN$2^{N-1'}$) for the lower program states E, P1, . . . , and $P_{2i-1}$ of the $(N+1)^{th}$ page.

As illustrated in FIG. 9, if the read voltages VR' (VRN1', VRN2', VRN$2^{N-1'}$) are applied to the $(N+1)^{th}$ page, 0 or 1 is read from memory cells having the lower program states E, P1, . . . , and $P_{2i-1}$ of the $(N+1)^{th}$ page. Here, 1 may be read from memory cells having the program state $P_{2i-1}$ of the lower program states E, P1, . . . , and $P_{2i-1}$ of the N+$1^{th}$ page having a highest voltage level. This is because an $(N+1)^{th}$ page of an N-bit MLC flash memory device, which is coded with a gray code, is programmed into "10011001.1001."

As illustrated in FIG. 9, 1 may be read from memory cells having upper program states $P_{2i}$, $P_{2i+1}$, and $P_2^{N+1}{}_{-1}$ of the $(N+1)^{th}$ page having higher voltage levels than the program state P2i−1 of the lower program states E, P1, . . . , and P2i−1 of the $(N+1)^{th}$ page having the highest voltage level.

When the readings operations are completely performed with respect to the memory cells having the lower program states E, P1, . . . , and $P_{2i-1}$ of the $(N+1)^{th}$ page in operation S1042, the bit level conversion control logic circuit 180 performs reading operations with respect to memory cells having the upper program states $P_{2i}$, $P_{2i+1}$, . . . , and $P_2^{N+1}{}_{-1}$ of the $(N+1)^{th}$ page in operation S1044.

Here, the bit level conversion control logic circuit 180 may convert the read voltages VRN1, VRN2, . . . , and VRN$2^{N-1}$ for the $N^{th}$ page into read voltages VRN1", VRN2", . . . , and VRN$2^{N-1"}$ for the upper program states $P_{2i}$, $P_{2i+1}$ . . . , and $P_2^{N+1}{}_{-1}$ of the N+$1^{th}$ page to perform the reading operations with respect to the memory cells having the upper program states $P_{2i}$, $P_{2i+1}$ . . . , and $P_2^{N+1}{}_{-1}$ of the $(N+1)^{th}$ page.

The bit level conversion control logic 180 transmits a third control signal XCON3 to the voltage generator 170 so that the voltage generator 170 generates the read voltages VR"(VRN1", VRN2", VRN$2^{N-1"}$) for the upper program states $P_{2i}$, $P_{2i+1}$ . . . , and P$2^{N+1-1}$ of the $(N+1)^{th}$ page.

As illustrated in FIG. 9, if the read voltages VR"(VRN1", VRN2", VRN$2^{N-1"}$) are applied to the N+$1^{th}$ page, 0 or 1 is read from memory cells having the upper program states $P_{2i}$, $P_{2i+1}$ . . . , and $P_2^{N+1}{}_{-1}$ of the $(N+1)^{th}$ page. Here, 1 may be read from memory cells having the program state of $P_{2i}$ of the upper program states $P_{2i}$, $P_{2i+1}$ . . . , and $P_2^{N+1}{}_{-1}$ of the $(N+1)^{th}$ page having the lowest voltage level.

As illustrated in FIG. 9, 1 may be read from memory cells having the lower program states E, P1, . . . , and $P_{2i-1}$ of the N+$1^{th}$ page having lower voltage levels than the program state $P_{2i}$ of the upper program states $P_{2i}$, $P_{2i+1}$ . . . , and $P_2^{N+1}{}_{-1}$ of the N+$1^{th}$ page having the lowest voltage level.

Figure 11:
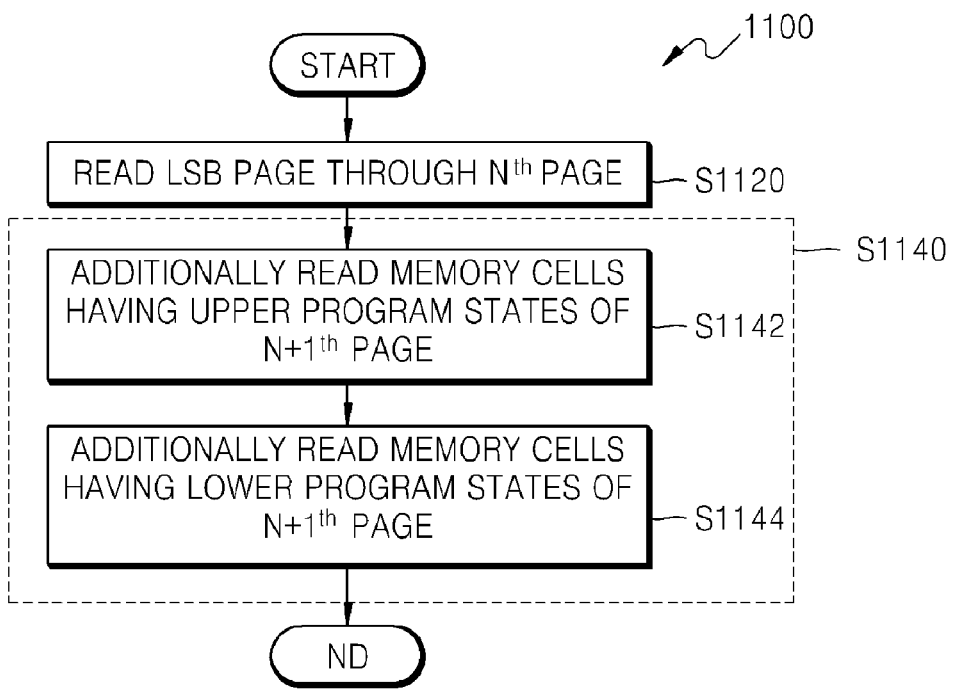
FIG. 11 is a flowchart of a reading method performed in the N-bit MLC flash memory of FIG. 5, according to another embodiment of the inventive concepts.

In the above-described embodiment, the reading operations are performed with respect to the lower program states E, P1, . . . , and $P_{2i-1}$ of the N+$1^{th}$ page, and then the reading operations are performed with respect to the upper program states $P_{2i}$, $P_{2i+1}$ . . . , and $P_2^{N+1}{}_{-1}$ of the N+$1^{th}$ page. However, the inventive concepts are not limited thereto. For example, attention is directed to the reading method 1100 of FIG. 11.

After operation S1120 is performed to perform reading operations with respect to an LSB page through an $N^{th}$ page, operation S1142 is performed to perform reading operations with respect to upper program states $P_{2i}$, $P_{2i+1}$ . . . , and $P_2^{N+1}{}_{-1}$ of an N+$1^{th}$ page. Operation S1144 is performed to perform reading operations with respect to lower program states E, P1, . . . , and $P_{2i-1}$ of the N+$1^{th}$ page to completely perform operation S1140 in which a reading operation is performed with respect to the $(N+1)^{th}$ page, in the N-bit MLC flash memory device 100.

According to the above-described reading method, reading operations are sequentially performed with respect to upper program states and lower program states of an $(N+1)^{th}$ page. Thus, N+1 or more bits are read from one memory cell of an N-bit MLC flash memory device without changing designs of read voltages and addresses in the N-bit flash memory device.

An embodiment of the inventive concepts will now be described in detail with respect to specific examples of executing (N+1)-bit programming and (N+1)-bit reading of an N-bit flash memory device.

Figure 12:
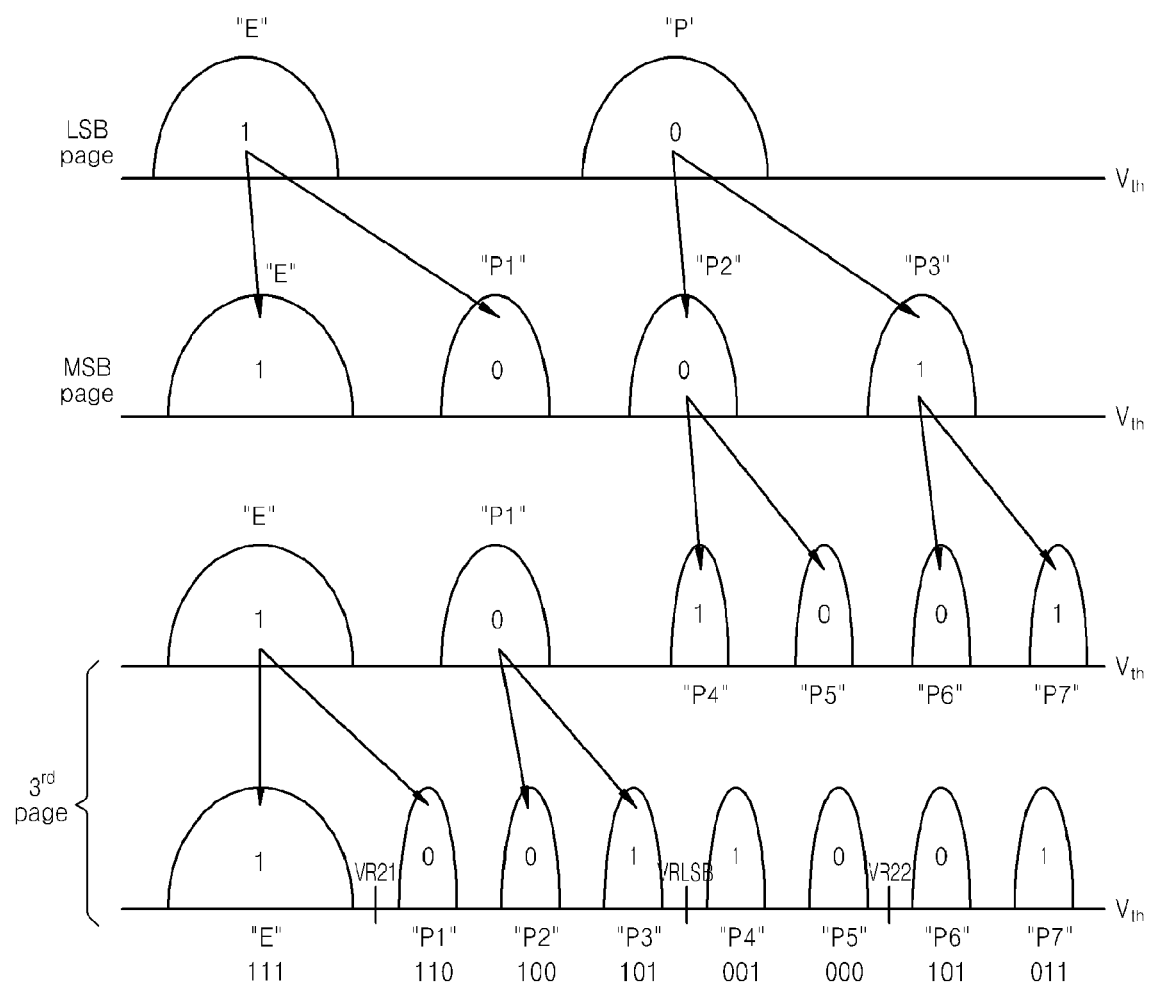
FIG. 12 illustrates a method of programming 3-bit data in a 2-bit MLC flash memory device according to an embodiment of the inventive concepts.

FIG. 12 illustrates 3-bit programming operations performed with respect to memory cells of a 2-bit MLC flash memory device.

Referring to FIGS. 1 and 12, the flash memory device 100 programs an LSB page and an MSB page corresponding to upper 2 bits of the data DTA to be programmed, through the control logic circuit 160. For example, if the data DTA includes three bits "001," the control logic circuit 160 executes LSB and MSB programming operations with respect to "00."

When the MSB is completely programmed, the control logic circuit 160 transmits a second control signal XCON2 to the bit level conversion control logic circuit 180, wherein the second control signal XCON2 includes information on other bit(s) of the data DTA, information on a voltage level of a program voltage for the MSB page and an address of the MSB, and the like.

The bit level conversion control logic circuit 180 applies an LSB read voltage VRLSB to the LSB page in response to the second control signal XCON2.

If the LSB read voltage VRLSB is applied, memory cells having second and third program states P2 and P3 of the MSB page are read. Memory cells having an erase state E and a first program state P1 of the MSB page are inhibited.

In this state, the bit level conversion control logic circuit 180 performs additional programming operations with respect to the second and third program states P2 and P3 of the MSB page. Therefore, as illustrated in FIG. 12, the second and third program states P2 and P3 of the MSB page are programmed into fourth through seventh program states P4 through P7 of a third page.

The fourth through seventh program states P4 through P7 of the third page may be respectively represented as "001," "000," "010," and "011." The fourth program state P4 of the third page may be formed by maintaining the second program state P2 of the MSB page without performing an additional programming operation.

The bit level conversion control logic circuit 180 performs additional programming operations with respect to the erase state E and the first program state P1 of the MSB page. Therefore, as illustrated in FIG. 12, the erase state E and the first program state P1 of the MSB page are programmed into an erase state E and first through third program states P1 through P3 of the third page.

Here, the erase state E and the first through third program states P1 through P3 may be respectively represented as "111," "110," "101," and "100." The erase state E of the third page may be formed by maintaining the erase state E of the MSB page without performing an additional programming operation.

According to the above-described programming method, even if a flash memory device according to the inventive concept is a 2-bit MLC flash memory device, the flash memory device may perform 3-bit programming. The erase state E and the program states P1 through P7 of the third page of FIG. 12 are represented as "100," "001," "000," "010," and "011," which are the same as values of cell distributions in the 3-bit MLC flash memory device of FIG. 4.

Figure 13:
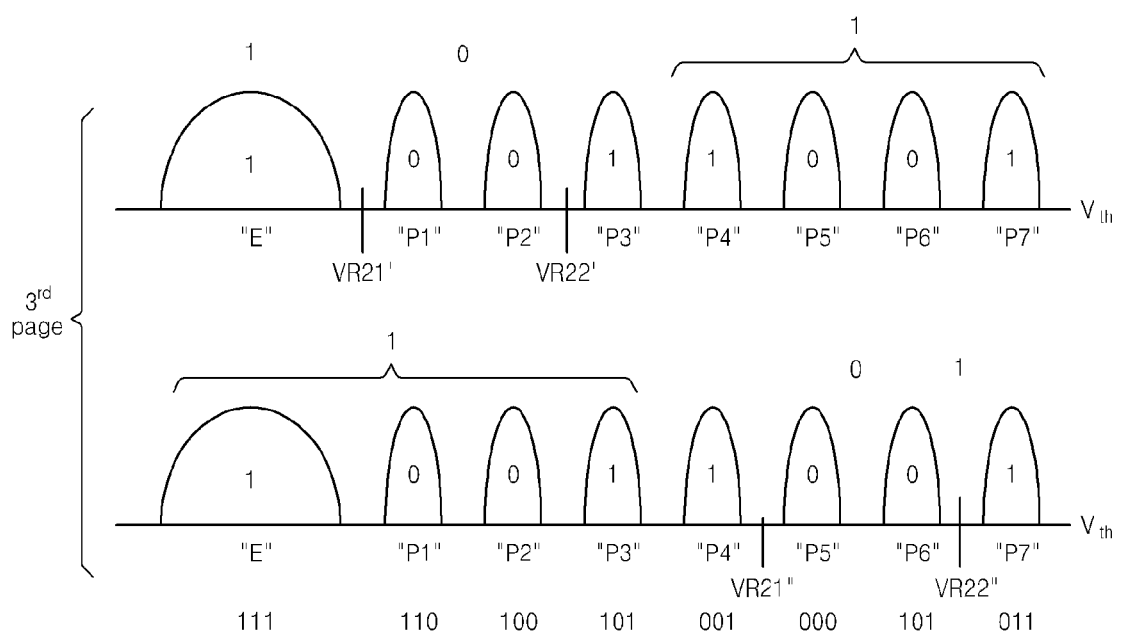
FIG. 13 illustrates a reading method performed in a flash memory device programmed by the method illustrated of FIG. 12.

FIG. 13 illustrates a reading operation performed in a flash memory device programmed according to the method described with reference to FIG. 12.

Referring to FIGS. 12 and 13, to read data programmed into 3 bits in a 2-bit MLC flash memory device, reading operations are performed with respect to LSB and MSB pages using three read voltages VRLSB, VR21, and VR22 of the 2-bit MLC flash memory device to read lower 2 bits of data programmed in a memory cell. An MSB is read.

First read voltages VR21' and VR22' of the third page are applied to the third page to read whether an MSB of lower program states of the third page is 0 or 1. Here, 1s are read from upper program states of the third page having higher voltages than the first read voltages VR21' and VR22' of the third page, like the third program state P3 of lower program states of the third page having a highest voltage level.

Second read voltages VR21" and VR22" of the third page are applied to the third page to read whether an MSB of upper program states of the third page are 0 or 1. 1s are read from lower program states of the third page having lower voltage levels than the second read voltages VR21" and VR22" of the third page, like the fourth program state P4 of the upper program states of the third page having a lowest voltage level.

Figure 14:
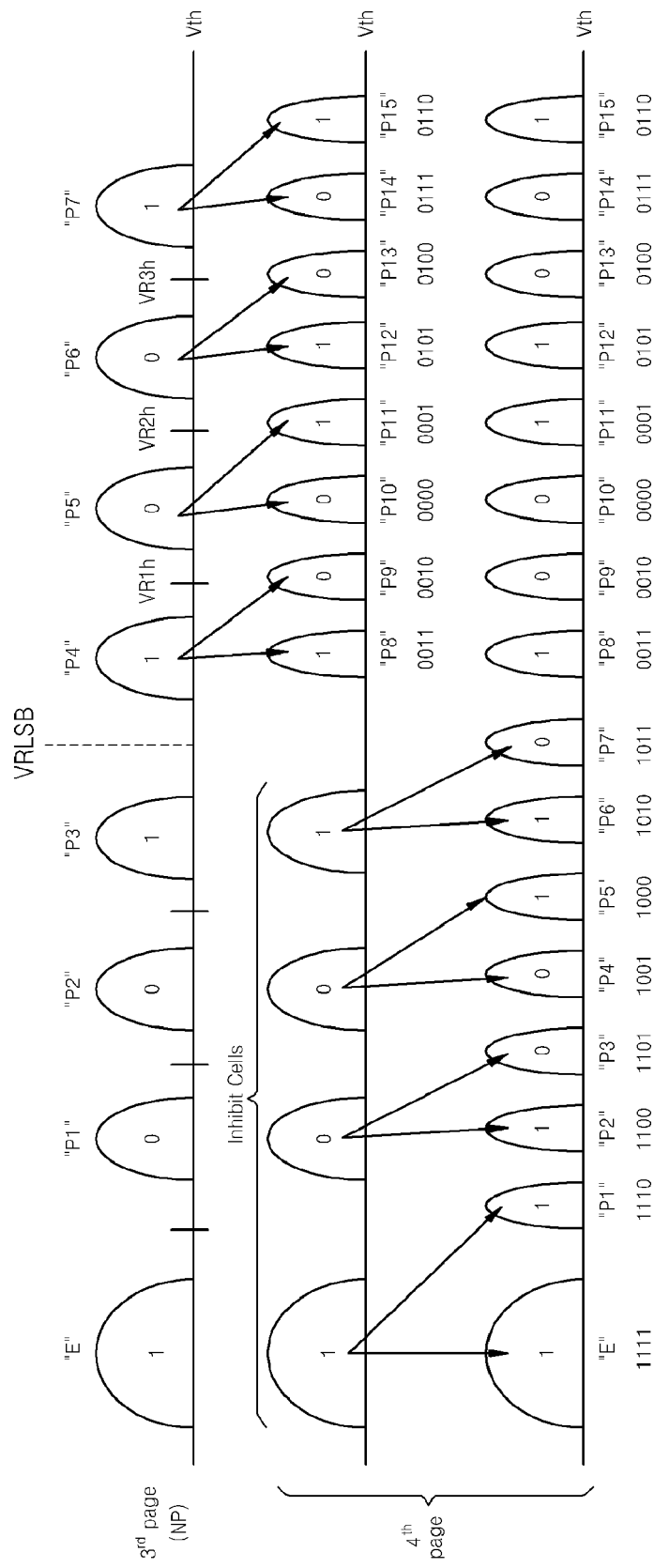
FIG. 14 illustrates a method of programming 4-bit data in a 3-bit MLC flash memory device according to an embodiment of the inventive concepts.

FIG. 14 illustrates 4-bit programming performed in memory cells of a 3-bit MLC flash memory device.

Referring to FIGS. 1 and 14, the flash memory device 100 programs an LSB page (a first page) through a third page corresponding to upper 3 bits of the data DTA through the control logic circuit 160. For example, if the data DTA includes four bits "0001," the control logic circuit 160 programs an LSB page, a second page, and an MSB page for "000."

If the third page is completely programmed, the control logic circuit 160 transmits a second control signal XCON2 to the bit level conversion control logic circuit 180, wherein the second control signal XCON2 includes information on other bit(s) of the data DTA, information on a voltage level of a program voltage of the MSB page, an address of the MSB page, and the like.

The bit level conversion control logic circuit 180 applies an LSB read voltage VRLSB to the LSB page in response to the second control signal XCON2.

If the LSB read voltage VRLSB is applied to the LSB page, memory cells having fourth and seventh program states P4 and P7 of the third page are read. If the LSB read voltage VRLSB is applied to the LSB page, memory cells having an erase state E and a third program state P3 of the third page are inhibited.

In this state, the bit level conversion control logic circuit 180 additionally programs the fourth through seventh states P4 through P7 of the third page. Therefore, as illustrated in FIG. 14, the fourth through seventh program states P4 through P7 of the third page are programmed into eighth through fifteenth program states P8 through P15 of a fourth page.

The eighth through fifteenth program states P8 through P15 of the fourth page may be respectively represented as "0011," "0010," "0000," "0001," "0101," "0100," "0111," and "0110." However, the seventh program state P7 of the fourth page may be formed by maintaining the fourth program state P4 of the third page without performing an additional programming operation.

The bit level conversion control logic circuit 180 additionally programs an erase state E and first through third program states P1 through P3 of the third page. Therefore, as illustrated in FIG. 14, the erase state E and the first through third program states P1 through P3 of the third page are programmed into an erase state E and first through seventh program states P1 through P7 of the fourth page.

Here, the erase state E and the first through seventh program states P1 through P7 of the fourth page may be respectively represented as "111," "1110," "1100," "1101," "1001," "1000," "1010," and "1011." However, the erase state E of the fourth page may be formed by maintaining the erase state E of the third page without performing an additional programming operation.

According to the above-described programming operation, even if a flash memory device according to an embodiment of the inventive concept is a 3-bit MLC flash memory device, the flash memory device may perform 4-bit programming. The erase state E and the first through seventh program states P1 through P7 of the third page of FIG. 12 may be respectively represented as ""1111," "1110," "1100," "1101," "1001," "1000," "1010," "1011," "0011," "0010," "0000," "0001," "0101," "0100," "0111," and "0110," which are the same as values of cell distributions in a 4-bit MLC flash memory device.

Figure 15:
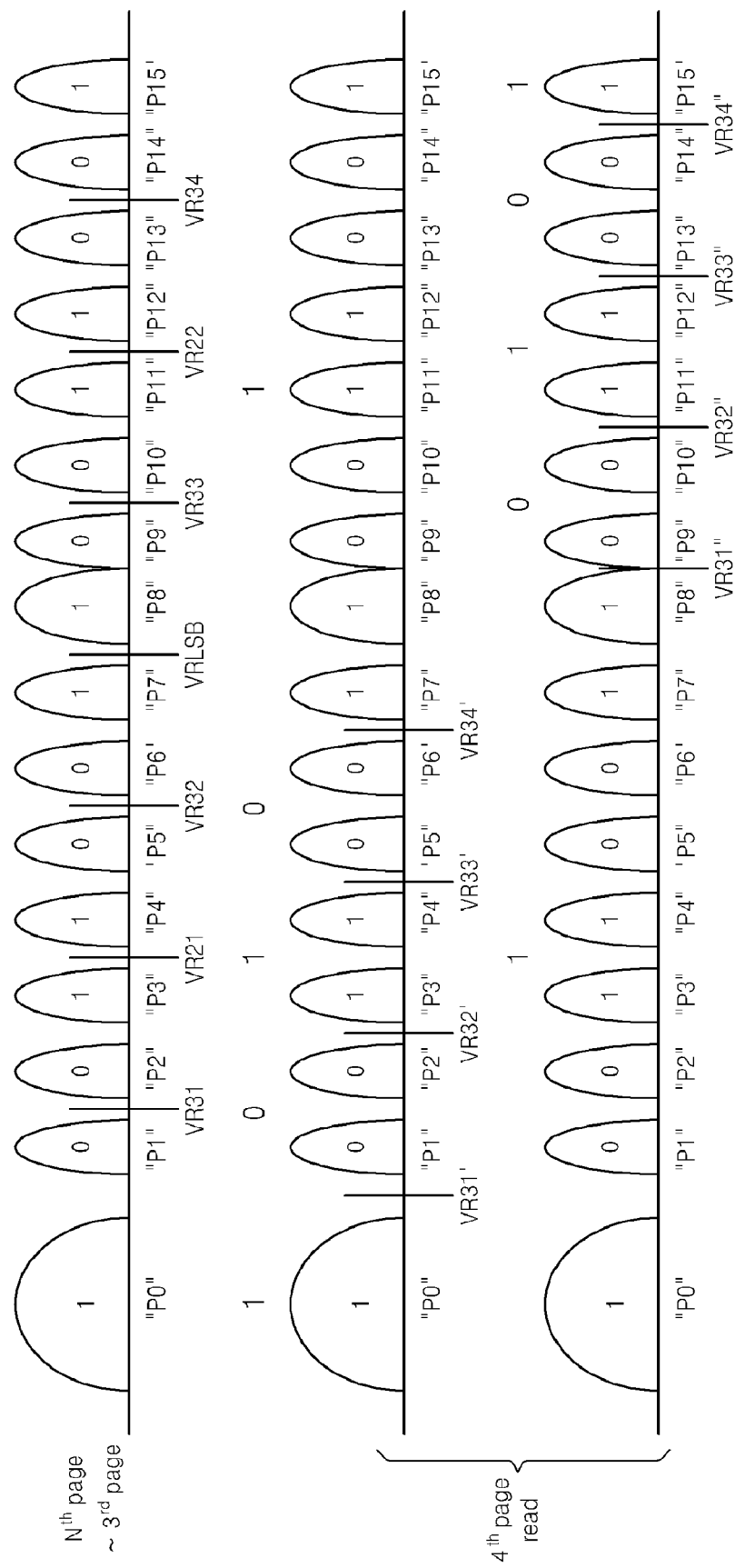
FIG. 15 illustrates a reading method performed in a flash memory device programmed by the method of FIG. 14.

FIG. 15 illustrates a reading operation performed in a flash memory device programmed according to the method described with reference to FIG. 14.

Referring to FIGS. 14 and 15, to read data programmed into 4 bits in a 3-bit MLC flash memory device, reading operations are performed with respect to an LSB page through a third page using seven read voltages VRLSB, VR21, VR22, VR31, VR32, VR33, VR34 of the 3-bit MLC flash memory device to read 3 bits of the data programmed in a memory cell. An MSB is read.

First read voltages VR31', VR32', VR33', and VR34' for a fourth page is applied to the fourth page to read whether an MSB of lower program states of the fourth page is 0 or 1. Here, 1s are read from upper program states of the fourth page having higher voltage levels than the first read voltages VR31', VR32', VR33', and VR34' of the fourth page, like a seventh program state P7 of lower program states of the fourth page having a highest voltage level.

Second read voltages VR31", VR32", VR33", and VR34" are applied to the fourth page to whether an MSB of the upper program states of the fourth page is 0 or 1.1s are read from lower program states of the third page having lower voltage levels than the second read voltages VR31", VR32", VR33", and VR34" of the fourth page, like an eighth program state P8 of the upper program states of the fourth page having a lowest voltage level.

In FIG. 14, programming with respect to the program state (the eighth program state P8 of the fourth page) of the upper program states of the fourth page having the lowest voltage level is simultaneously performed along with programming with respect to the upper program states of the fourth page. The eighth program state P8 of the upper program states of the fourth page having the lowest voltage level is formed by maintaining the program state of the upper program states of the third page (the fourth program state P4 of upper program states of the third page) having the lowest voltage level.

However, the inventive concepts are not limited to the specific embodiments described above.

Figure 16:
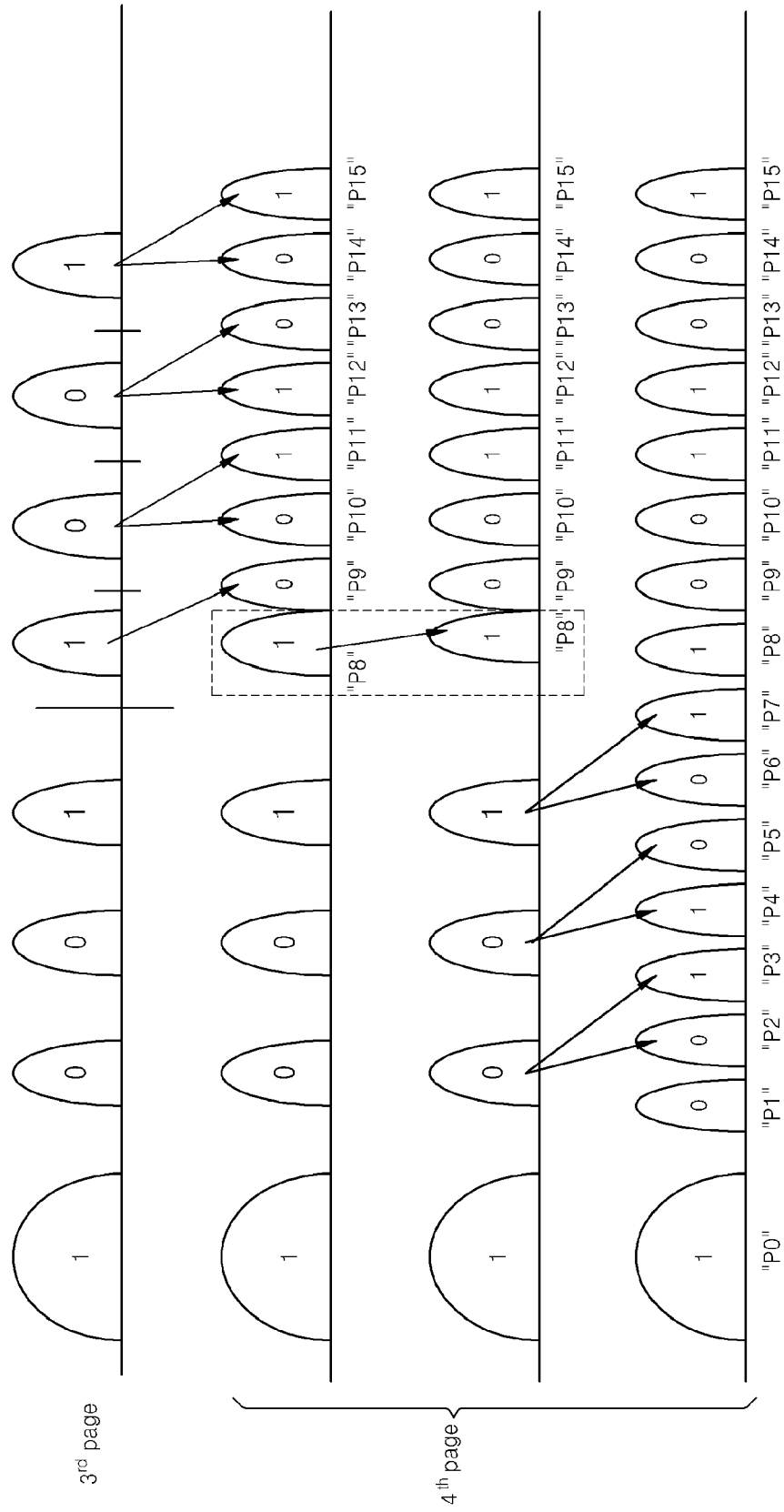
FIG. 16 illustrates a programming method according to another embodiment of the inventive concepts.

Referring to FIG. 16, illustrating a programming method according to another embodiment of the inventive concepts, a program state (an eighth program state P8 of a fourth page) of upper program states of a last page having a lowest voltage level is programmed after other upper program sates (ninth through fifteenth program states P9 through P15 of the fourth page) of the last page are programmed.

Figure 17:
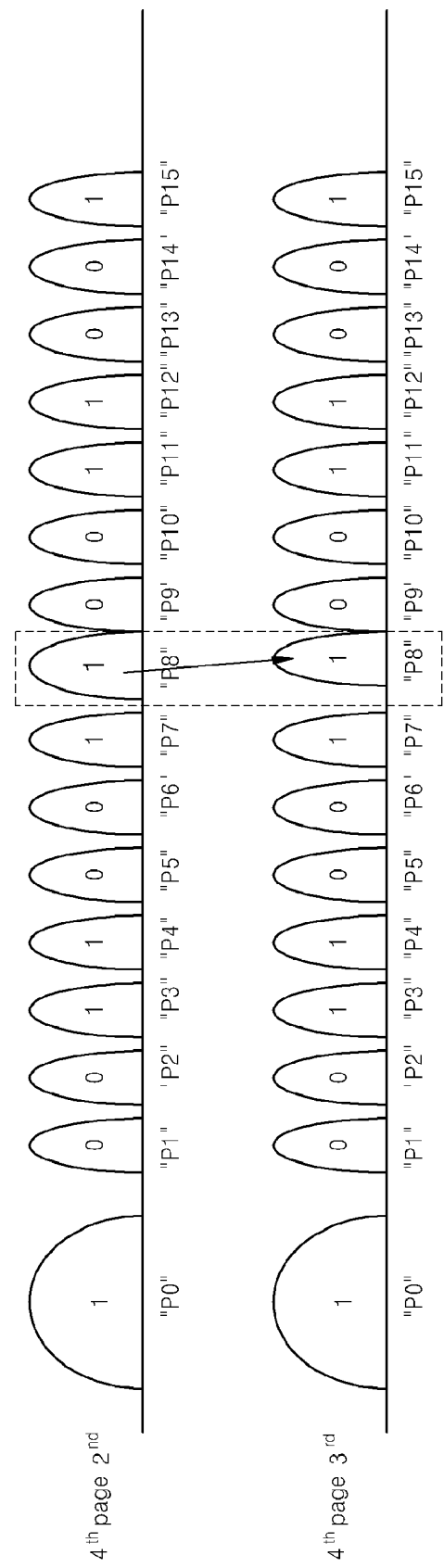
FIG. 17 illustrates a programming method according to another embodiment of the inventive concepts.

Referring to FIG. 17, illustrating a programming method according to another embodiment of the inventive concepts, a program state (an eighth program state P8 of a fourth page) of upper program states of a last page having a lowest voltage level is programmed after other upper program states (ninth through fifteenth program states P9 through P15 of the fourth page) of the last page and lower program states (an erase state E and firs through seventh program states P1 through P7 of the fourth page) of the last page are programmed.

A reading operation with respect to data programmed according to the programming method described with reference to FIG. 16 or 17 can be readily performed using the reading methods described in the previous embodiments of the inventive concepts. Therefore, its detailed description thereof is omitted here to avoid redundancy.

According to a flash memory device, and programming and reading methods performed in the flash memory device, of the inventive concepts, N+1 bits may be programmed and read without changing a design of a flash memory device which is configured to program and reads N bits.

Also, N+2 or more bits may be programmed and read without changing the design of a flash memory device configured to program and read N bits.

Figure 18:
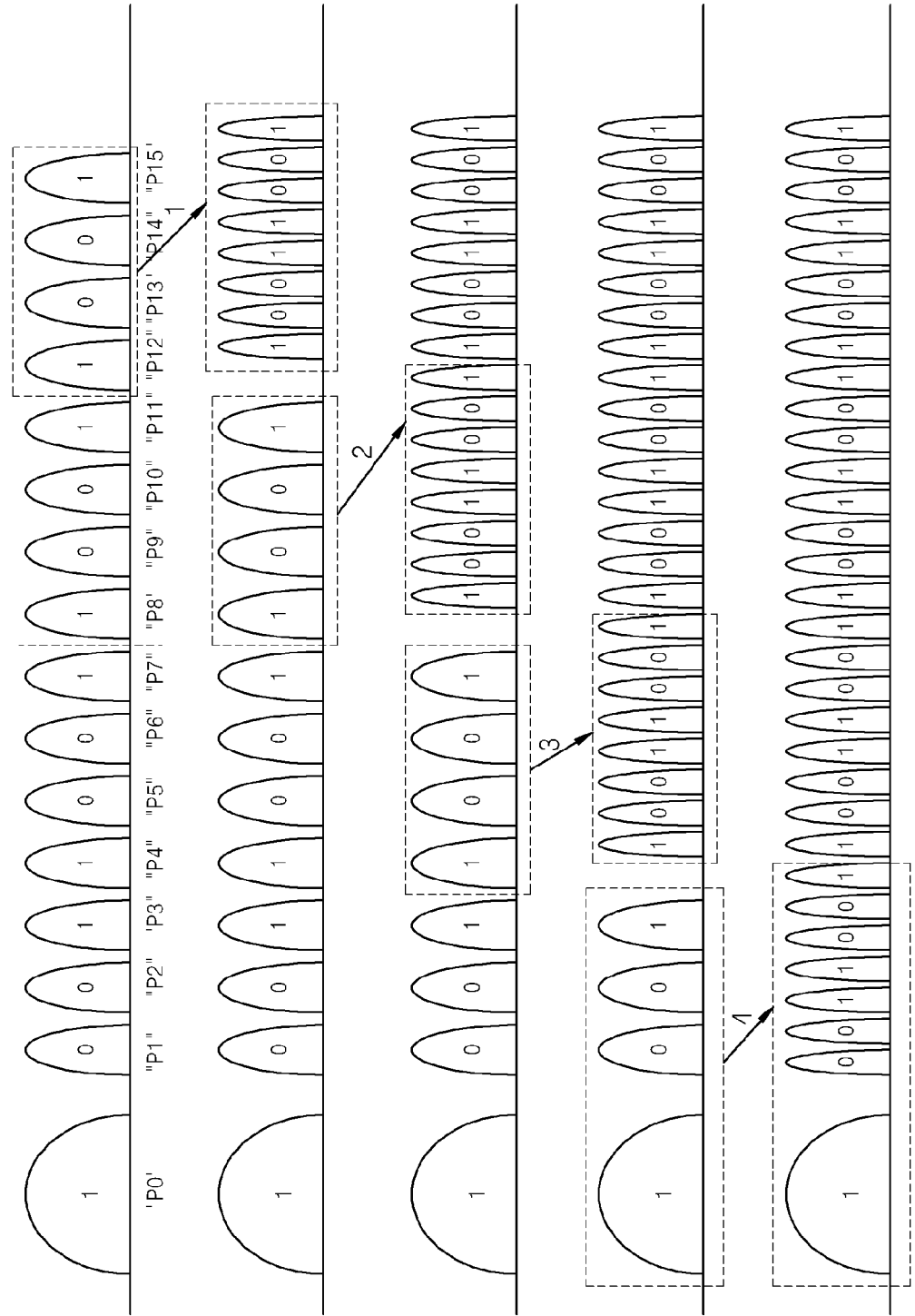
FIG. 18 illustrates a method of programming 5-bit data in a 3-bit MLC flash memory device according to an embodiment of the inventive concepts.

Reference is made to FIG. 18 illustrating a programming method of programming 5-bit data in a 3-bit MLC flash memory device. Here, the 3-bit MLC flash memory device programs a fourth bit to form a fourth page as illustrated in FIG. 14. A programming operation is performed two times with respect to an erase state E and upper program states (eighth through fifteenth program states P8 through P15) of 15 program states of a fourth page to form upper program states of a fifth page as marked with allows 1 and 2. A programming operation is performed two times with respect to lower program sates (an erase state E and first through seventh programs P1 through P7) of the fourth page to form lower program states of the fifth page as marked with allows 3 and 4.

The two times programming operations with respect to the upper program states (the eighth through fifteenth program states P8 through P15) of the fourth page and the two times programming operations with respect to the lower program states (the erase state E and the first through seventh program states P1 through P7) of the fourth page may be respectively performed according to the programming method described with reference to FIG. 5. 5-bit data programmed by the programming method of FIG. 18 may be read by the reading method of FIG. 9. Therefore, the detailed description thereof is omitted here to avoid redundancy.

As described above, according to a flash memory device and programming and reading methods performed in the flash memory device of the inventive concepts, N+1 or more bits may be programmed and read without changing a design of a flash memory device configured to program and read N bits.

Figure 19:
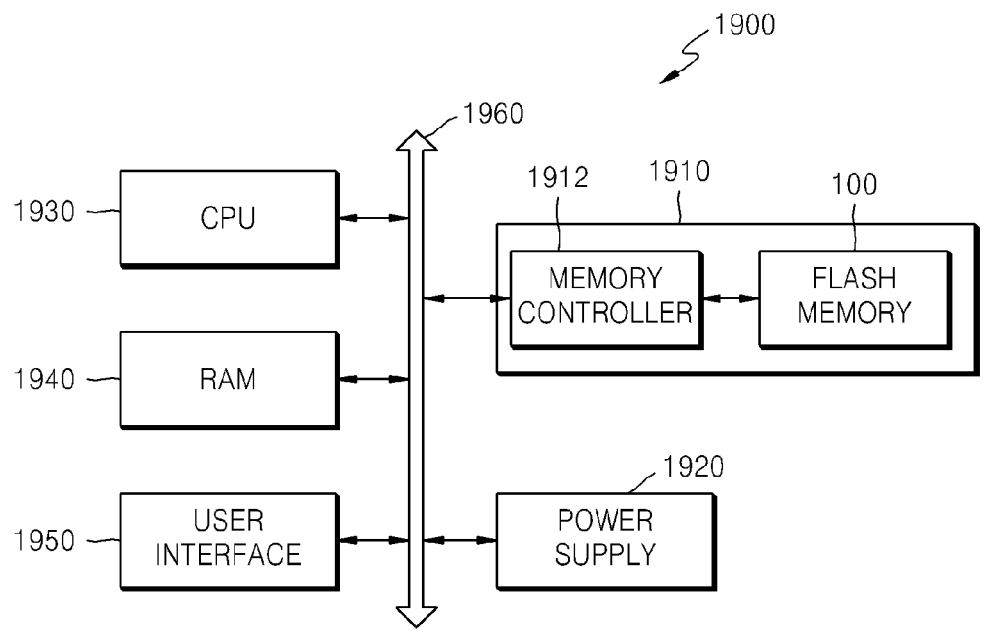
FIG. 19 is a block diagram of a computing system including the flash memory device of FIG. 1, according to an embodiment of the inventive concepts.

FIG. 19 is a block diagram of a computing system including a flash memory device according to an embodiment of the inventive concepts.

A computing system 1900 according to the current embodiment includes a central processing unit (CPU) 1930 which is electrically connected to a bus 1960, a user interface 1950, and a memory system 1910 including a memory controller 1912 and the flash memory device 100 of FIG. 1. The flash memory device 100 stores N-bit (where N is an integer equal to or more than 1) data, which is processed and/or is to be processed by the microprocessor 1930, through the memory controller 1912. The computing system 1900 further includes a random access memory (RAM) 1940 and a power supply device 1920.

If the computing system 1900 is a mobile device, the computing system 1900 may additionally include a battery and a modem, such as a baseband chipset, for supplying an operating voltage of the computing system 1900. The computing system 1900 may further include an application chipset, a camera image processor (CIS), a mobile dynamic random access memory (DRAM), and the like, and their detailed descriptions will be omitted.

The memory controller 1912 and the flash memory device 100 may constitute a solid state drive/disc (SSD) which uses a nonvolatile memory to store data.

Figure 20:
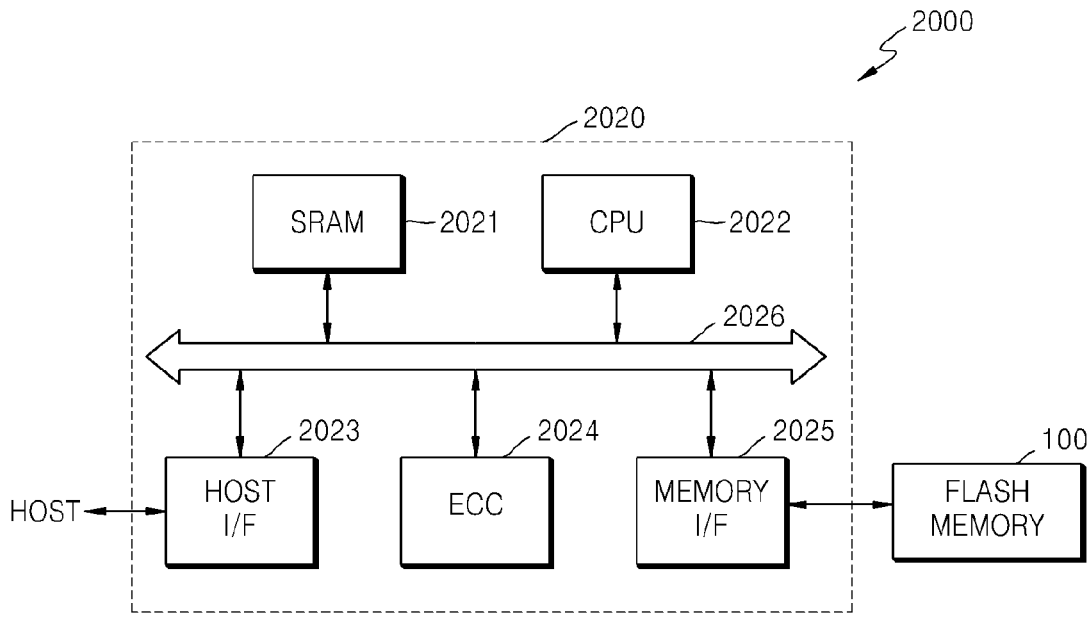
FIG. 20 is a block diagram of a memory card including the flash memory device of FIG. 1.

A flash memory device according to the inventive concept as described above may constitute a memory card 2000 along with a memory controller 2020 as illustrated in FIG. 20. In this case, the memory controller 2020 communicates with an external device (e.g., a host) through one of various interface protocols including a universal serial bus (USB), a multimedia card (MMC), a peripheral component interconnect-express (PCI-E), a serial advanced technology attachment (SATA), a parallel advanced technology attachment (PATA), a small computer system interface (SCSI), an enhanced small disk interface (ESDI), integrated drive electronics (IDE), and the like. Structures and operations of a CPU 2022, a static random access memory (SRAM) 2021, a host interface (I/F) 2023, an error check and correct (ECC) engine 2024, a memory I/F 2025, and a bus 2026 of the memory controller 2020 of FIG. 20 will not be described in detail herein.

A flash memory device according to the inventive concept may be installed using various types of packages. For example, a flash memory device according to the inventive concept may be installed using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concepts have been particularly shown and described with reference to exemplary embodiments thereof, it will be understood that various changes in form and details may be made therein without departing from the spirit and scope of the following claims.

What is claimed is:

1. A programming method performed in an N-bit MLC flash memory device, where N is a natural number of at least two, comprising:

programming first through $N^{th}$ bits of data in a memory cell array of the N-bit MLC flash memory device in response to a program command; and after the first through $N^{th}$ bits of the data are completely programmed, programming an $(N+1)^{th}$ bit of the data by converting voltage levels of voltages, which are used for programming the first through $N^{th}$ bits of data, to program for $2^N$ cell distributions of $2^{N+1}$ cell distributions corresponding to the $(N+1)^{th}$ bit of the data and then to program for other $2^N$ cell distributions.

2. The programming method of claim 1, wherein the programming of the $(N+1)^{th}$ bit of the data comprises programming for upper $2^N$ cell distributions of the $2^{N+1}$ cell distributions having higher voltage levels than an LSB read voltage used for reading a first bit of the data and programming for lower $2^N$ cell distributions having lower voltage levels than the LSB read voltage.

3. The programming method of claim 1, wherein the programming of the $(N+1)^{th}$ bit of the data comprises programming for upper $2^N$ cell distributions of the $2^{N+1}$ cell distributions having lower voltage levels than an LSB read voltage used for reading a first bit of the data and programming for lower $2^N$ cell distributions having higher voltage levels than the LSB read voltage.

* * * * *